(12) United States Patent
Reijers

(10) Patent No.: US 6,291,114 B1
(45) Date of Patent: *Sep. 18, 2001

(54) PHOTOMASK WITH A MASK EDGE PROVIDED WITH A RING-SHAPED ESD PROTECTION AREA

(75) Inventor: Antonius A. M. Reijers, Nijmegen (NL)

(73) Assignee: .S. Philips Corporation, New York, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/460,931

(22) Filed: Dec. 14, 1999

(30) Foreign Application Priority Data

Dec. 14, 1998 (EP) .................................................. 98204223

(51) Int. Cl.[7] ...................................................... G03F 9/00
(52) U.S. Cl. .............................. 430/5; 361/212; 361/220
(58) Field of Search ............................ 430/5, 311, 313, 430/319; 361/212, 220

(56) References Cited

U.S. PATENT DOCUMENTS 4,617,605   10/1986   Obrecht et al. ...................... 361/220

5,989,754 * 11/1999 Chen et al. ............................ 430/5

FOREIGN PATENT DOCUMENTS 1385606       2/1975   (DE) .
402178913-A * 7/1990   (JP) .
05100410      4/1993   (JP) .

* cited by examiner

*Primary Examiner*—Janet Baxter
*Assistant Examiner*—Barbara Gilmore
(74) *Attorney, Agent, or Firm*—Steven R. Biren

(57) ABSTRACT

A photomask (1) comprises a transmissive base plate (2) a first side of which is provided with a layer of a metallic mask material (4). In this layer, a mask pattern (5) is formed which is enclosed by an inner region (6) and an outer region (7) of mask material, the inner region and the outer region being separated by a ring-shaped protection area (8). In this protection area, a protection pattern (9) is formed having tracks (10) with end portions (11) situated near the inner and outer regions and at a distance (12) therefrom, which distance is small compared to the smallest distance between pattern parts in the mask pattern (5). The photomask is thus protected against electrostatic discharges, which could damage the mask pattern.

8 Claims, 1 Drawing Sheet

PHOTOMASK WITH A MASK EDGE PROVIDED WITH A RING-SHAPED ESD PROTECTION AREA

BACKGROUND OF THE INVENTION

The invention relates to a photomask comprising a base plate of a radiation-transmitting and electrically insulating material, a first side of which is provided with a layer of an electroconductive mask material wherein a mask pattern to be imaged is formed which is enclosed by an inner edge and an outer edge of a mask material, which edges are electrically separated from each other by a ring-shaped protection area.

Such a photomask can particularly suitably be used in the manufacture of semiconductor devices and flat panel displays. In practice, the base plate generally is a plate of quartz glass, the layer of mask material generally contains chromium. The pattern of the mask is imaged, often on a reduced scale, on a layer of a photoresist which is provided, for example, on a layer of a metal. After exposure and development of the photoresist, the layer of metal can be etched in a pattern of conductor tracks corresponding to the mask pattern. The photomask pattern to be imaged comprises many closely spaced tracks of a mask material which are sometimes connected to larger areas of a mask material. The tracks correspond to the conductor tracks to be formed in the layer of metal, and the areas correspond to, for example, bond pads to be formed in the metal layer, which bond pads are used for contacting the devices to be manufactured.

The photomask has an edge of a conductive mask material, which is divided into an inner edge and an outer edge which are electrically separated from each other by a ring-shaped protection area. This ring-shaped area serves to protect the photomask against damage by electrostatic discharges (Electro-Static Discharge) which may occur in the mask pattern.

In operation, a photomask having a mask pattern which is enclosed by a closed edge of a conductive mask material, damage due to electrostatic discharges may occur. The mask material present on the electrically insulating base plate may become electrically charged. This may be caused, for example, by air flowing past or by friction caused by contact with clothing and other insulating materials. In order to be able to image the photomask onto the layer of photoresist, the photomask is placed in a projector on a grounded mask holder. In this manner, the closed edge of masking material present around the mask pattern is grounded. Between this edge and the mask pattern voltage differences may develop whose magnitude is such that electric discharges occur in the mask pattern leading to said damage.

In JP-A-5-100410, a description is given of a photomask of the type mentioned in the opening paragraph, in which photomask the mask material is entirely removed from the ring-shaped protection area. This empty ring-shaped area has a width ranging from 0.5 to 2 mm.

If the conductive mask material is electrically charged as described hereinabove, then only the outer edge is grounded if the photomask is placed in a projector. If the empty protection area sufficiently insulates the outer edge and the inner edge from each other, then no voltage difference between the inner edge and the mask pattern will develop. Electrostatic discharges which may damage the mask pattern seem to be precluded in this way. However, it has been found in practice that charge present on the inner edge and in the mask pattern can cause damage in spite of the presence of the empty ring-shaped protection area.

SUMMARY OF THE INVENTION

It is an object of the invention to provide, inter alia, a photomask with sufficient ESD protection. To achieve this, the photomask is characterized in accordance with the invention in that the ring-shaped protection area comprises a protection pattern formed in the layer of mask material, which protection pattern has tracks having an end situated near the inner edge or outer edge and at a distance from said inner edge or outer edge which is smaller than the smallest distance between pattern parts present in the mask pattern.

If the conductive mask material is electrically charged, and if the outer edge is subsequently grounded, then a voltage develops between the outer edge and the structures enclosed by said outer edge, i.e., viewed from said edge to the center, the protection pattern, the inner edge and the mask pattern. The protection pattern is more vulnerable than the mask pattern because the protection area comprises conductive tracks of the protection pattern which are situated very close to the inner edge and the outer edge. The distances are smaller than the distances between parts of the mask pattern; they are, for example, 0.8 μm, if the distance between the parts in the mask pattern is 1 μm. Therefore, if the voltage is high enough, an electrostatic discharge takes place in the protection pattern. Since the charge present in the photomask is at least substantially removed, damage to the mask pattern by electrostatic discharges is precluded. The protection pattern may become locally damaged, however, it has been found that in this case mask material is sputtered off, so that no short-circuit takes place between the outer edge and the inner edge. Undamaged parts of the protection pattern which are situated next to the damaged part thereof take over the protection of the mask pattern when a subsequent electrostatic discharge takes place. Only after many discharges involving damage to the protection pattern, said protection pattern would stop functioning. In practice, however, this state is not reached.

A more secure protection is obtained if the tracks have a width at the location of an end situated near the inner edge or the outer edge, which is smaller than the width of the narrowest mask tracks present in the mask pattern, the first width being, for example, 0.8 μm if the second width is 1 μm. The electric fields between the edges and the proximate ends of the tracks of the protection pattern will then, at an equal electric voltage, be greater than the electric fields between tracks in the mask pattern.

Preferably, the tracks are connected with an end situated near the inner edge or the outer edge to areas of mask material incorporated in the protection pattern. If a photomask comprising a protection pattern with areas, and a photomask comprising an identical protection pattern yet without areas are charged in a similar manner, for example in a flow of ionized air, the outer edge being grounded, then electrostatic discharge occurs sooner in the former protection pattern than in the latter protection pattern.

The mask pattern may also include relatively large areas, such as the above-mentioned bond pads. It has been found that, in an unprotected photomask, damage caused by electrostatic discharges occurs relatively easily near these relatively large areas. To make sure that the protection pattern also provides sufficient protection against said damage, the areas which are connected to the tracks having an end situated near the inner edge or the outer edge, have a surface area which is larger than that of the largest mask areas present in the mask pattern. This and the relatively small width of the tracks connected to the protection pattern are responsible for the fact that the protection pattern is more vulnerable to electrostatic discharges than the mask pattern.

Preferably, the areas which are connected to the tracks having an end situated near the inner edge or the outer edge, are connected to further tracks having an end situated near other areas incorporated in the protection pattern and at a distance therefrom which is smaller than the smallest distance between pattern parts present in the mask pattern. As a result, the discharge may take place in the protection pattern without causing serious damage to said pattern. For the reasons stated hereinabove, the width of the further tracks preferably is smaller than that of the narrowest mask tracks present in the mask pattern, and the surface area of the further areas is larger than that of the largest mask areas present in the mask pattern.

A simple pattern is obtained if in the protection pattern all tracks are identical as well as all areas.

The best protection is obtained if the protection pattern fills the entire ringshaped protection area. In this case, the charge present on the part of the photomask situated inside the outer edge can be discharged in all directions, without detours, to the outer edge.

These and other aspects of the invention will be apparent from and elucidated with references to the embodiment(s) described hereinafter.

BRIEF DESCRIPTION OF THE DRAWINGS

In the drawings.

The Figures are not drawn to scale; in the Figures, like reference numerals refer to like parts.

DESCRIPTION OF THE PREFERRED EMBODIMENTS

Figure 1:
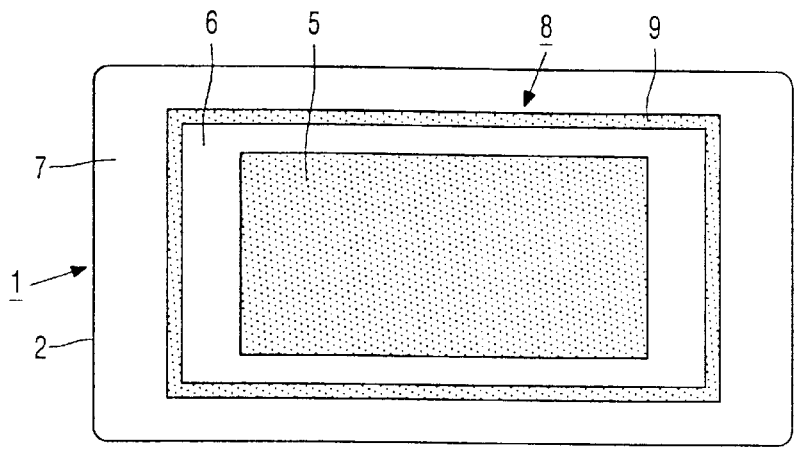
FIG. 1 is a diagrammatic plan view of a photomask in accordance with the invention.
Figure 2:
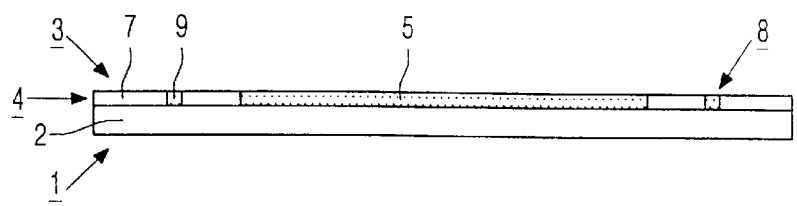
FIG. 2 is a diagrammatic cross-sectional view of the photomask shown in FIG. 1, FIG. 3 diagrammatically shows a few protection patterns which may be used in the photomask shown in FIGS. 1 and 2.

FIG. 1 is a plan view, and FIG. 2 a cross-sectional view of a photomask 1 comprising a base plate 2 of a radiation-transmitting and electrically insulating material, which in this example is an approximately 5 mm thick plate of quartz glass. A first side 3 of this base plate 2 is provided with a layer of an electroconductive mask material 4. In this example, this mask material is a customary approximately 100 nm thick layer of chromium whose surface is provided with an anti-reflection layer of chromium oxide (not shown). A mask pattern 5 to be imaged is formed in the layer of mask material 4. This pattern is enclosed by an inner edge 6 and an outer edge 7 of mask material, which are electrically insulated from each other by a ring-shaped protection area 8.

The mask pattern 5 is imaged, often on a reduced scale, onto a layer of a photoresist which is applied, for example, to a layer of a metal. After exposure and development of the photoresist, the metal layer can be etched in a pattern of conductor tracks corresponding to the mask pattern. The photomask pattern to be imaged comprises many closely spaced tracks of a mask material, which tracks are not shown in the drawings and which are sometimes connected to larger areas of mask material, which are not shown either. The tracks correspond to conductor tracks to be formed in the layer of metal, the areas correspond, for example, to bond pads to be formed in the layer of metal, which bond pads are used for contacting the devices to be manufactured.

The photomask has an edge 6, 7 of a conductive mask material, which edge is divided into an inner edge 6 and an outer edge 7 which are electrically insulated from each other by a ring-shaped protection area 8. This ring-shaped area is used to protect the photomask against damage by electrostatic discharges (Electro-Static Discharge) which may occur in the mask pattern 5.

The ring-shaped protection area 8 comprises a protection pattern 9 which is formed in the layer of mask material 4 and which includes tracks 10 having an end 11 which is situated near the inner edge 6 or the outer edge 7 and at a distance 12 from said edge which is smaller than the smallest distance between pattern parts (not shown) present in the mask pattern 5.

If the conductive mask material 4 is electrically charged and if, subsequently, the outer edge 7 is grounded, then a voltage develops between the outer edge 7 and the structures which it surrounds; i.e., from the edge to the center, the protection pattern 9, the inner edge 6 and the mask pattern 5. The protection pattern 9 is more vulnerable than the mask pattern 5 because the protection area 8 includes conductive tracks 11 of the protection pattern 9 which are situated very close to the outer edge 7 and very close to the inner edge 6. The distances are smaller than the distances between parts of the mask pattern; they are for example 0.8 $\mu$m if the distance between the parts in the mask pattern are 1 $\mu$m. This is the reason why, if said voltage is high enough, an electrostatic discharge takes place in the protection pattern 9. This may locally damage the protection pattern 9, but the mask pattern 5 remains undamaged. Since the charge present in the photomask 1 is at least largely removed, damage to the mask pattern 5 by electrostatic discharges is precluded.

A more secure protection is obtained if the tracks 10 have an end 11 whose width near the inner edge 6 or outer edge 7 is smaller than that of the narrowest mask tracks present in the mask pattern, i.e. the first width is, for example, 0.8 $\mu$m if the second width is 1 $\mu$m. The electric fields between the edges and the ends of the tracks of the protection pattern, which ends are situated close to the edges, will then, at an equal electric voltage, be larger than the electric fields between tracks in the mask pattern.

Figure 3:
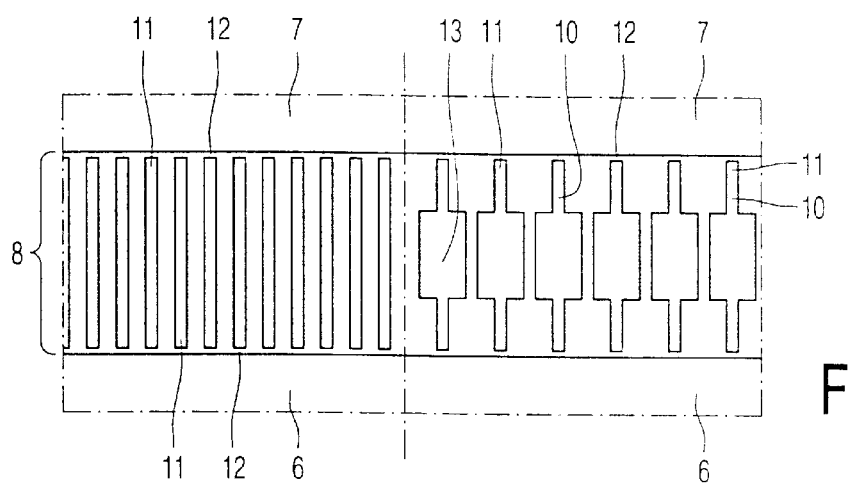
Figure 4:
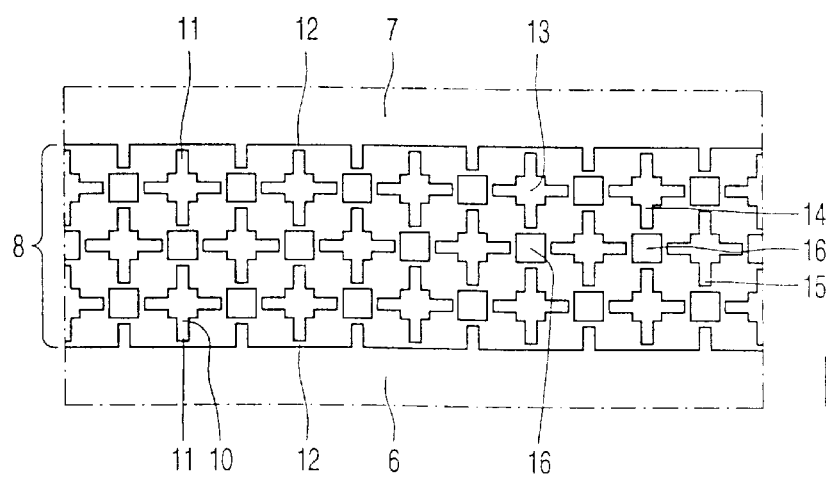
FIG. 4 is an embodiment of a protection pattern which may be used in the photomask shown in FIGS. 1 and 2.

Preferably, the tracks 10 are connected with an end 11 situated near the inner edge 6 or outer edge 7 to areas 13 of a mask material incorporated in the protection pattern 8, as shown in the right part of FIG. 3 and in FIG. 4. If a photomask 1 with a protection pattern 8 having areas 13, and a photomask 1 with an identical protection pattern 8 yet without areas is charged in a similar manner, for example in a flow of ionized air, the outer edge 7 being grounded, then electrostatic discharge occurs sooner in the former than in the latter.

The mask pattern 5 will, in practice, also comprise relatively large areas, such as bond pads, having a length and a width of, for example, 100 $\mu$m. It has been found that near these relatively large areas, an unprotected photomask is also easily damaged by electrostatic discharges. To make sure that the protection pattern 8 also offers sufficient protection against this damage, the areas 13, which are connected to the tracks 10 having an end 11 situated near the inner edge 6 or outer edge 7, have a surface area which is larger than that of the largest mask areas present in the mask pattern. These areas have a length and a width of, for example, 200 $\mu$m. This and the relatively small width of the tracks 10 connected thereto cause the protection pattern to be more vulnerable to electrostatic discharges than the mask pattern 5.

Preferably, the areas 13 are connected, as shown in FIG. 4, to further tracks 14 whose end 15 is situated near further areas 16 incorporated in the protection pattern and at a distance 17 from said areas which is smaller than the smallest distance between pattern parts present in the mask pattern 5. As a result, electrostatic discharge may take place in the protection pattern 8 without causing serious damage to said protection pattern. For the reasons stated hereinabove, the further tracks 14 have a width which is preferably smaller than that of the narrowest mask tracks present in the mask pattern, and the further areas 16 have a surface area which is larger than that of the largest mask areas present in the mask pattern.

A simple pattern is obtained if, in the protection pattern, all tracks 11 and 15 are identical and all areas 13 and 16 are identical.

The best protection is obtained if the protection pattern 9, as shown in FIG. 1, tills the entire ring-shaped protection area 8. In this case, the charge present on the part 8, 6, 5 of the photomask 1 situated within the outer edge 7 can be discharged in all directions, without detours, to the outer edge 7. In the example shown in FIG. 4, the areas 13 and 16 have a length and width of 200 $\mu$m, and the tracks 11 and 14 have a length of 49 $\mu$m and a width of 2 $\mu$m, while the distances 12 and 17 are 1 $\mu$m. The protection pattern shown in FIG. 4 is used to protect photomasks which are employed to manufacture semiconductor circuits having smallest distances and smallest dimensions of 1 $\mu$m. Upon projection, the photomask is reduced by a factor of 5, so that the smallest dimensions in the mask pattern are 55 $\mu$m.

What is claimed is:

1. A photomask comprising a base plate of a radiation-transmitting and electrically insulating material, a first side of which is provided with a layer of an electroconductive mask material wherein a mask pattern to be imaged is formed which is enclosed by an inner edge and an outer edge of a mask material, which edges are electrically separated from each other by a ring-shaped protection area, characterized in that the ring-shaped protection area comprises a protection pattern formed in the layer of mask material, which protection pattern has tracks having an end situated near the inner edge or outer edge and at a distance from said inner edge or outer edge which is smaller than the smallest distance between pattern parts present in the mask pattern.

2. A photomask as claimed in claim 1, characterized in that the tracks have a width at the location of an end situated near the inner edge or the outer edge, which is smaller than the width of the narrowest mask tracks present in the mask pattern.

3. A photomask as claimed in claim 1, characterized in that the tracks are connected with an end situated near the inner edge or the outer edge to areas of mask material incorporated in the protection pattern.

4. A photomask as claimed in claim 3, characterized in that the areas which are connected to the tracks having an end situated near the inner edge or the outer edge, have a surface area which is larger than that of the largest mask areas present in the mask pattern.

5. A photomask as claimed in claim 4, characterized in that the areas which are connected to the tracks having an end situated near the inner edge or the outer edge, are connected to further tracks having an end situated near other areas incorporated in the protection pattern and at a distance therefrom which is smaller than the smallest distance between pattern parts present in the mask pattern.

6. A photomask as claimed in claim 5, characterized in that the width of the further tracks is smaller than that of the narrowest mask tracks present in the mask pattern, and the surface area of the further areas is larger than that of the largest mask areas present in the mask pattern.

7. A photomask as claimed in claim 3, characterized in that in the protection pattern all tracks are identical as well as all areas.

8. A photomask as claimed in claim 1, characterized in that the protection pattern fills the entire ring-shaped protection area.

* * * * *